(12) United States Patent
Gole

(10) Patent No.: US 7,186,392 B2
(45) Date of Patent: Mar. 6, 2007

(54) OXYNITRIDE COMPOUNDS, METHODS OF PREPARATION, AND USES THEREOF

(75) Inventor: James L. Gole, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/371,788

(22) Filed: Mar. 9, 2006

(65) Prior Publication Data

US 2006/0159609 A1 Jul. 20, 2006

(51) Int. Cl.
*C01B 21/082* (2006.01)
*C01F 17/00* (2006.01)
(52) U.S. Cl. ...................... 423/263; 423/385
(58) Field of Classification Search ................ 423/263, 423/385
See application file for complete search history.

(56) References Cited

U.S. PATENT DOCUMENTS

| 4,734,390 A | * | 3/1988 | Marchand et al. | ......... | 501/96.1 |
| 5,444,173 A | * | 8/1995 | Oyama et al. | ............. | 585/671 |
| 2002/0151434 A1 | * | 10/2002 | Domen et al. | .............. | 502/200 |

OTHER PUBLICATIONS

A Semiconductor Giant Ramps Up Its R&D http://web24.epnet.com/citation.asp?tb=I &_ug=dbs+0+In+en%2Dus+sid+9D6D30F2%2DB470%2D... ; Robert F. Service, Sep. 14, 2001; (5 pages).

Innovation, Chemical Week, Dec. 18/25, 2002, pp. 23-25, www.chemweek.com (3 pages).

Structure, electrical and chemical properties of zirconium nitride films deposited by dc reactive magnetron sputtering, Applied Physics A, 64, 593-595 (Jun. 1997), D. Wu, Z. Zhang, W. Fu, X. Fan, H. Guo, (4 pages).

Hydrogen Catalytic Oxidation Reaction on Pd-Doped Porous Silicon, IEEE Sensor Journal, vol. 2, No. 2, Apr. 2002, pp. 89-95, Christos Tsamis, et al., (6 pages).

Dye-Sensitized Core-Shell Nanocrystals: Improved Efficiency of Mesoporous Tin Oxide Electrodes Coated with a Thin Layer of an Insulating Oxide, Chem. Mater. Jul. 14, 2002, 2930-2935, Andreas Kay and Michael Gratzel (6 pages).

Journal, Morphological Control of Zirconia Nanoparticles through Combustion Aerosol Synthesis, Amit U. Limaye and Joseph J. Helble, vol. 85, No. 5, May 2002, pp. 1127-1132 (6 pages).

EBSCO Host, Zirconium Dioxide, F. Russo, Partis Paul, and A. Dana; American Ceramic Society Bulletin, vol. 80, Issue 8, Aug. 2001; http://web24epnet.com/citation.asp?tb=1 &_ug=dbs+0+In+en%2Dus+sid+9D6D30F2%2DB470%2D... (3 pages).

Journal of Catalysis 204, 249-252 (Nov. 2001), Nanocatalysis: Selective Conversion of Ethanol to Acetaldehyde Using Monoatomically Dispersed Copper on Silica Nanospheres, James L. Gole and Mark G. White, (4 pages).

(Continued)

*Primary Examiner*—Wayne A. Langel
(74) *Attorney, Agent, or Firm*—Thomas, Kayden, Horstemeyer & Risley, LLP

(57) ABSTRACT

Oxynitride nanoparticles, methods of preparation thereof, and methods of use thereof are disclosed. One representative oxynitride nanoparticle includes a $M_xO_yN_z$ nanoparticle, where x is in the range of about 1 to 3, y is in the range of about 0.5 to less than 5, and z is in the range of about 0.001 to 0.5.

30 Claims, 7 Drawing Sheets

OTHER PUBLICATIONS

Surface Modification and Optical Behavior of $TiO_2$ Nanostructures, S.M. Prokes, et al., MRS Proceedings, Dec. 2002 (6 pages).

Smalltimes, Big News in Small Tech, Konarka Harnesses the Sun God in Pursuit of a Scientist's Dream; Matt Kelly; Sep. 2002, (4 pages).

JACS Articles, J.Am. Chem. Soc. Sep. 2002, 124, 11514-11518, Hot-Fluid Annealing for Crystalline Titanium Dioxide Nanoparticles in Stable Suspension, Jun Lin, et al., (5 pages).

Colloquium, Study of $Nd^{3+}$, $Pd^{2+}$, $Pt^{4+}$, and $Fe^{3+}$ dopant effect on photoreactivity of $TiO_2$ nanoparticles, S. I. Shah, et al., ; PNAS/Apr. 30, 2002, vol. 99; pp. 6482-6486; www.pnas.org/cgi/doi/10.1073/pnas.052518299, (5pages).

Applied Physics Letters, vol. 72, No. 23, Jun. 8, 1998, Single-Mode Optical Waveguide Fabricated by Oidization of Selectively Doped Titanium Porous Silicon, Seiichi Nagata, et al., (3 pages).

Efficient Photochemical Water Splitting by a Chemically Modified n-$TiO_2$, Shahed U. M. Khan, et al., www.sciencemag.org, Science; Sep. 27, 2002, vol. 297, (3 pages).

Journal, Novel Method to Prepare Electroconductive Titanium Nitride-Aluminum Oxide Nancomposites, Jingguo Li, et al., J. AM. Ceram. Soc. 85 [3] 724-26 (Mar. 2002), (3 pages).

Journal, Synthesis of Nanocrytalline Titanium Nitride Powders by Direct Nitridation of Titanium Oxide, Jingguo Li, et al., J. AM. Ceram. Soc. 84 [12] 3045-47 (Dec. 2001), (3 pages).

When it Comes to Nanocoatings, Size Matters, R&D Magazine—Aug. 2002, www.rdmag.com, (2 pages).

Advanced Powder Technol., vol. 11, No. 2, pp. 211-220 (Jun. 2000), Preparation and Characterization of nanocrystalline doped $TiO_2$, Sergei V. Zaitsev, et al., (10 pages).

Advanced Powder Technol., vol. 11, No. 4, pp. 415-422 (Dec. 2000), A Novel Chemical Solution Technique for the Preparation of Nano Size Titanium Powders from Titanium Dioxide, S. Amarchand, et al.; (8 pages).

Inorg. Chem. Oct. 2001, 40, 5371-5380, Dye Seneitization of Nanocrystalline Titanium Dioxide with Square Planar Platinum (II) Diimine Dithiolate Complexes, Ashraful Islam, et al., (10 pages).

Applied Physics B 70, 261-265 (Feb. 2000)/Digital Object Identifier (DOI) 10.1007/s003409900161, Photoluminescence in. Anatase Titanium Dioxide Nanocrystals, W.F. Zhang, et al., (5 pages).

R&D Review of Toyota CRDL vol. 36, No. 3 (Sep. 2001), Visible-light Photocatalysis in Nitrogen-doped Titanium Oxides, Takeshi Morikawa (1 page).

Journal, J. AM. Cerm. Soc. 84 [12] 3045-47 (Dec. 2001), Synthesis of Nanocrystalline Titanium Nitride Powders by Direct Nitridation of Titanium Oxide, Jingguo Li, et al.; (3 pages).

Nitriding of Tetragonal Zirconia in a High Current D.C. Plasma Source; Delachaux, et al.; Thin Solid Films; vol. 425 (2003), pp. 113-116, no month.

Raman Investigation of the Nitridation of Yttria-Stabilized Tetragonal Zirconia; Deghenghi, et al.; Journal of the American Ceramic Society, vol. 86, Jan. 2003, pp. 169-173.

The Ruthenium Catalysed Synthesis of Carbon Nanostructures; Mabudafhasi, et al.; Carbon, vol. 40, (2002), pp. 2737-2742, no month.

Influence of Titanium Oxide on the Surface Interactions of $MO$ ($M$ = Cu and Ni) /$\gamma$-$Al_2O_3$ Catalysts; Hu, et al.; Journal of Solid State Chemistry; vol. 170, (2003), pp. 58-67, no month.

Photoactivity and Phase Stability of $ZrO_2$-doped Anatase-Type $TiO_2$ Directly Formed as Nanometer-Sized Particles by Hydrolysis Under Hydrothermal Conditions; Hirano, et al.; Journal of Solid State Chemistry, vol. 170, (2003), pp. 39-47, no month.

$TiO_2$-Mediated Photocatalytic Degradation of a Triphenylmethane Dye (Gentian Violet), in Aqueous Suspensions; Saquib, et al.; Dyes and Pigments, vol. 56, (2003), pp. 37-49, no month.

Solar Cells with Porphyrin Sensitization: Wamser, et al.; Optical Materials vol. 21 (2002); pp. 221-224, no month.

The Surface Science of Titanium Dioxide; Diebold, U.; Surface Science Reports; vol. 48; (2003), pp. 53-229, no month.

Preparation and Characterization of the Nanocrystalline $Ti_{0.5}C_{ro.5}O_xN_y$ Powder; Li, et al.; Materials Letters; vol. 57 (2003) pp. 1062-1065, no month.

Environmental Catalysis: Adsorption and Decomposition of Nitrous Oxide on Zirconia; Miller, et al.; Journal of the American Chemical Society; vol. 117; (1995), pp. 10969-10975, no month.

The Influence of Silver Additives in Titania Photoactivity in the Photooxidation of Phenol; Dobosz, et al.; Water Research; vol. 37, (2003) pp. 1489-1496, no month.

A Novel Series of Water Splitting Photocatalysts $NiM_2O_6$ (M = Nb, Ta) Active Under Visible Light; Ye, et al.; International Journal of Hydrogen Energy; vol. 28 (2003) pp. 651-655, no month.

* cited by examiner

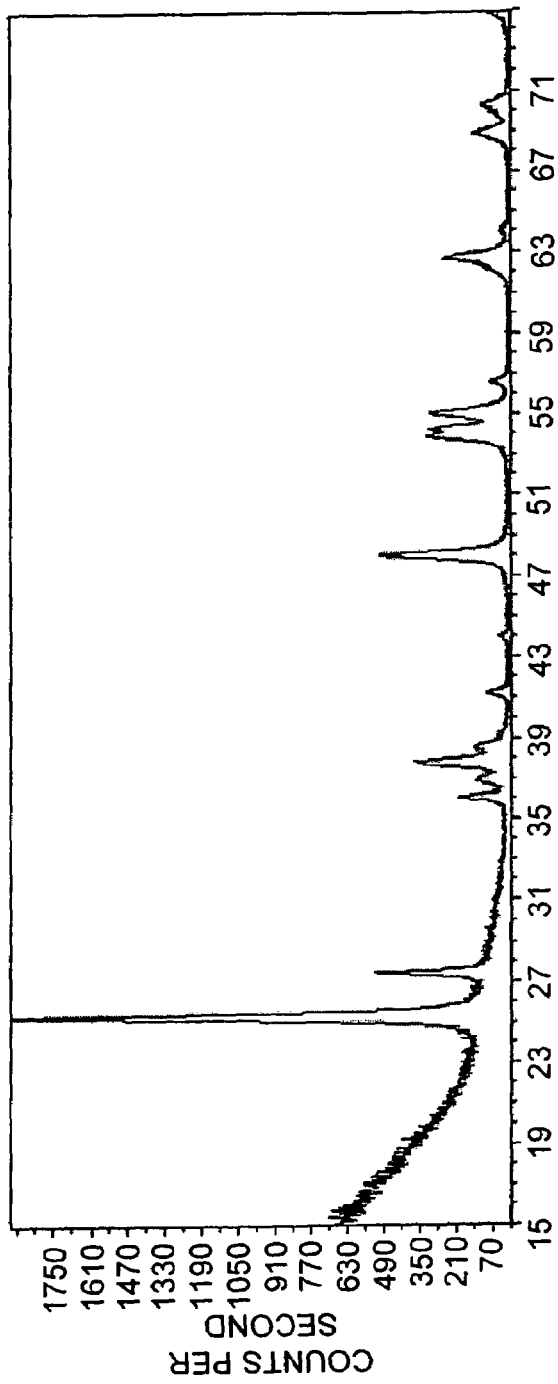
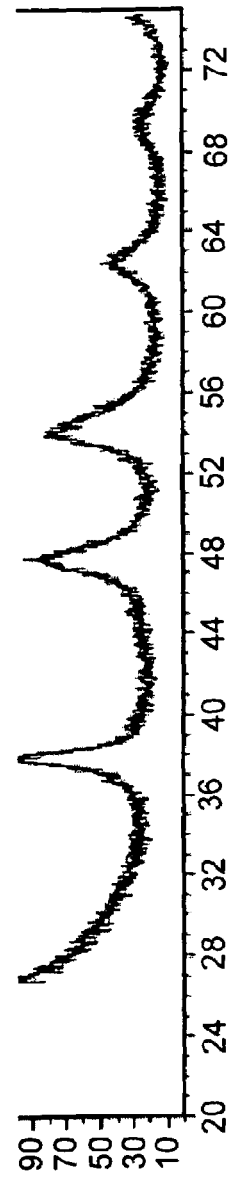
FIG. 5A
FIG. 5B

OXYNITRIDE COMPOUNDS, METHODS OF PREPARATION, AND USES THEREOF

CROSS-REFERENCE TO RELATED APPLICATION

This application claims priority to copending U.S. Provisional Application entitled, "Generation of $TiO_{2-x}N_x$ Photocatalysts from the Solution Phase Nitration of $TiO_2$," filed with the United States Patent and Trademark Office on Dec. 21, 2001, and assigned Ser. No. 60/342,947, which is entirely incorporated herein by reference.

TECHNICAL FIELD

The present invention is generally related to oxide compounds and, more particularly, is related to oxynitride compounds and methods of preparation thereof.

BACKGROUND OF THE INVENTION

The initial observation of the photoinduced decomposition of water on titanium dioxide ($TiO_2$) has promoted considerable interest in solar cells and the semiconductor-based photocatalytic decomposition of water and of other organic materials in polluted water and air. A continued focus on $TiO_2$ has resulted because of its relatively high reactivity and chemical stability under ultraviolet excitation (wavelength<387 nanometers), where this energy exceeds the bandgaps of both anatase (3.2 eV) and rutile (3.0 eV) crystalline n-$TiO_2$.

However, both anatase and rutile $TiO_2$ crystals are poor absorbers in the visible region (wavelength>380 nm) and the cost and accessibility of ultraviolet photons make it desirable to develop photocatalysts that are highly reactive under visible light excitation, utilizing the solar spectrum or even interior room lighting.

With this focus, several attempts have been made to lower the bandgap energy of crystalline $TiO_2$ by transition metal doping and hydrogen reduction. One approach has been to dope transition metals into $TiO_2$ and another has been to form reduced $TiO_x$ photocatalysts. However, doped materials suffer from a thermal instability, an increase of carrier-recombination centers, or the requirement of an expensive ion-implantation facility. Reducing $TiO_2$ introduces localized oxygen vacancy states below the conduction band minimum of titanium dioxide so that the energy levels of the optically excited electrons will be lower than the redox potential of the hydrogen evolution and the electron mobility in the bulk region will be small because of the localization.

Films and powders of titanium oxynitride ($TiO_{2-x}N_x$) have revealed an improvement over titanium dioxide under visible light in optical absorption and photocatalytic activity such as photodegradation of methylene blue and gaseous acetaldehyde, and hydrophilicity of the film surface. Substitutional doping of nitrogen by sputtering a titanium dioxide target in a nitrogen/argon gas mixture has been accomplished. After being annealed at 550° C. in nitrogen gas for four hours, the films were crystalline with features assignable to a mixed structure of the anatase and rutile crystalline phases. The films were yellowish in color and their optical absorption spectra showed them to absorb light between 400–500 nm, whereas films of pure titanium dioxide did not. Photocalytic activity for the decomposition of methylene blue shows activity of $TiO_{2-x}N_x$ at wavelengths less than 500 nm.

The active wavelength of $TiO_{2-x}N_x$ of less than 500 nm promises a wide range of applications, as it covers the main peak of the solar irradiation energy beyond Earth's atmosphere. Further, it is an excellent light source, peaking at 390 to 420 nm, provided by recently-developed light-emitting indium gallium nitride diodes.

In addition, nitrogen can be incorporated into the $TiO_2$ structure by the nitridation reaction of $TiO_2$ nanopowders that are subjected to a ammonia ($NH_3$) gas flow at about 600° C. Transmission electron microscope micrographs showed that the synthesized TiN powder consisted of uniform spherical particles with an average diameter of about 20 nm when nitridation was performed at a temperature of about 600° C. for 2–5 hours. No results with respect to the photocatalytic activity of this material were presented.

The synthesis of chemically modified n-type $TiO_2$ by the controlled combustion of Ti metal in a natural gas flame at a temperature of about 850° C. represented another attempt at lowering the band gap energy of $TiO_2$. The modified films were dark gray, porous in structure and with an average composition of n-$TiO_{2-x}C_x$ (with x about 0.15). This material absorbs light at wavelengths below 535 nm and has a lower band-gap energy than rutile $TiO_2$ (2.32 versus 3.00 electron volts). When illuminated with a 150 Watt xenon (Xe) lamp, and at an applied potential of 0.3 volt, the chemically modified n-$TiO_{2-x}C_x$ (with x about 0.15) exhibited a higher water photoconversion efficiency (8.3%) than that of pure $TiO_2$ illuminated under the same conditions (1%).

All these examples require the use of very high temperature synthesis conditions, and long periods of time to produce these materials. The time and temperature previously required to make the $TiO_{2-x}N_x$ and $TiO_{2-x}C_x$ compounds makes these techniques costly and inefficient.

Thus, a heretofore unaddressed need exists in the industry for a simple more cost effective method to fabricate novel materials capable of exhibiting photo catalytic activity such as the photo-induced decomposition of water and pollutants. Additionally, a need exists for better methods for their use in the production of electricity through solar cells, as well as to address some of the aforementioned deficiencies and/or inadequacies.

SUMMARY OF THE INVENTION

Embodiments of the present invention provide for oxynitride nanoparticles, methods of preparation thereof, and methods of use thereof. One representative of an embodiment of a nanostructure of the present invention includes a $M_xO_yN_z$ nanoparticle, wherein x is in the range of about 1 to 3, y is in the range of about 0.5 to less than 5, and z is in the range of about 0.001 to about 0.5.

Another embodiment of the present invention provides for methods of forming oxynitride nanostructures. An exemplary method includes providing at least one type of $M_hO_i$ nanoparticle, wherein h is in the range of about 1 to 3 and i is in the range of about 1 to 5; providing a solution of an alkyl amine; and mixing the at least one type of $M_hO_i$ nanoparticle and the solution of alkyl amine until a reaction between the at least one type of $M_hO_i$ nanoparticle and alkyl amine is substantially complete.

Other systems, methods, features, and advantages of the present invention will be or become apparent to one with skill in the art upon examination of the following drawings and detailed description. It is intended that all such additional systems, methods, features, and advantages be included within these descriptions, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5A is an XRD powder pattern for untreated titanium dioxide powders. FIG. 5B is an XRD powder pattern for titanium oxynitride partially agglomerated nanoparticles corresponding with the sharply rising reflectance spectrum at 550 nm. While the XRD patterns in FIGS. 5A and 5B are indicative of the anatase phase, the broad XRD pattern for palladium treated titanium oxynitride may be attributed to a structural transformation.

DETAILED DESCRIPTION

Figures 1A, 1B:
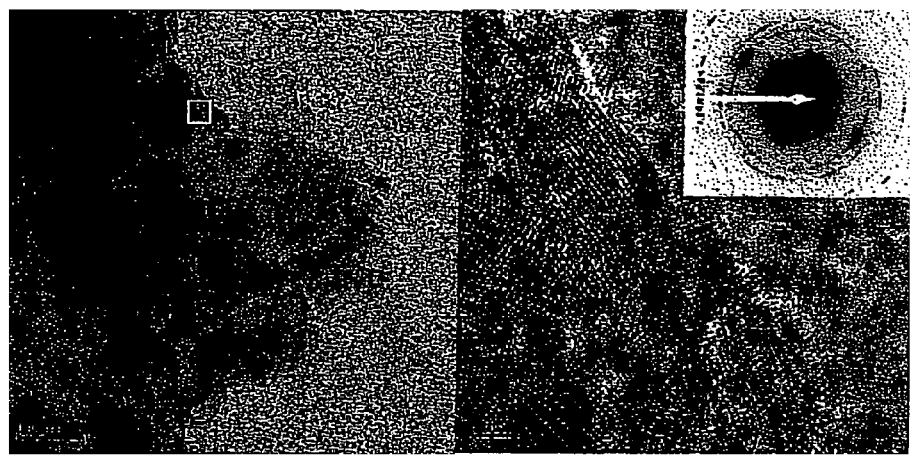
FIG. 1A is a low resolution transmission electron micrograph (TEM) image of titanium oxynitride nanostructures.
FIG. 1B is a high resolution (HR) TEM image showing the polycrystalline character and lattice planes of the sample. The HR TEM image corresponds to an anatase crystal structure confirmed by the x-ray powder diffraction pattern shown in the inset.

Embodiments of the present invention provide for oxynitride nanoparticles having the following formula: $M_xO_yN_z$, where M is a metal, a metalloid, a lanthanide, or an actinide, O is oxygen, N is nitrogen, x can range from about 1 to 3, y is about 0.5 to less than 5 and z is about 0.001 to 0.5, about 0.001 to 0.2, and about 0.001 to 0.1.

Another embodiment of the present invention provides for methods of preparation of $M_xO_yN_z$ nanoparticles. An exemplary method of preparing $M_xO_yN_z$ nanoparticles includes mixing at least one type of oxide nanoparticle (described below) with at least one alkyl amine at room temperature until the reaction between the oxide nanoparticle and alkyl amines is substantially complete (e.g., typically less than 60 seconds). The result is the formation of $M_xO_yN_z$ nanoparticles. Subsequently, the $M_xO_yN_z$ nanoparticles can be dried in a vacuum and stored for use in the future.

In addition, another embodiment provides for oxynitride nanoparticles having the following formula: $M1_{x1}M2_{x2}O_yN_z$, where M1 and M2 can be a metal, a metalloid, a lanthanide, an actinide, or combinations thereof; x1 and x2 are in the range from about 1 to 3; y is about 0.5 to less than 5; and z is about 0.001 to 0.5. Another embodiment provides for methods of preparing $M1_{x1}M2_{x2}O_yN_z$ nanoparticles. The method is similar to the method described above in regard to $M_xO_yN_z$ nanoparticles and will be described in more detail below.

Another embodiment of the present invention provides for $M_xO_yN_z$ nanoparticles having catalytic metal ($M_xO_yN_z$ [$M_{CAT}$]) disposed thereon and/or therein. A representative method of the preparation of $M_xO_yN_z[M_{CAT}]$ nanoparticles includes mixing at least one type of oxide nanoparticle with at least one alkyl amine and a catalytic metal compound until the reaction between the oxide nanoparticle, alkyl amines, and catalytic metal compound is substantially complete (e.g., typically less than 60 seconds). The result is the formation of $M_xO_yN_z[M_{CAT}]$ nanoparticles. Subsequently, the $M_xO_yN_z[M_{CAT}]$ particles can be vacuum dried and stored for use in the future.

In addition, another embodiment provides for $M1_{x1}M2_{x2}O_yN_z$ nanoparticles having catalytic metal ($M1_{x1}M2_{x2}O_yN_z$ [$M_{CAT}$]) disposed thereon and/or therein and methods of formation thereof. The method is similar to the method described above in regard to $M_xO_yN_z[M_{CAT}]$ nanoparticles and will be discussed in more detail below.

Other embodiments of the present invention include the use of one or more types of $M_xO_yN_z$, $M_xO_yN_z$ [$M_{CAT}$], $M1_{x1}M2_{x2}O_yN_z$, and/or $M1_{x1}M2_{x2}O_yN_z$ [$M_{CAT}$] nanoparticles in catalysts, for photocatalytic reactors, in photocatalytic supports, in solar panel energy systems, and in pigments.

For example, one or more types of $M_xO_yN_z$, $M_xO_yN_z$ [$M_{CAT}$], $M1_{x1}M2_{x2}O_yN_z$, and/or $M1_{x1}M2_{x2}O_yN_z$ [$M_{CAT}$] nanoparticles can be used as a photocatalyst for converting water into hydrogen and oxygen. In addition, one or more types of $M_xO_yN_z$, $M_xO_yN_z$ [$M_{CAT}$], $M1_{x1}M2_{x2}O_yN_z$, and/or $M1_{x1}M2_{x2}O_yN_z$ [$M_{CAT}$] nanoparticles can be used in the photodegradation of organic molecules present in polluted water and air.

In particular, $TiO_{2-x}N_x$ and/or $TiO_{2-x}N_x[Pd]$ nanoparticles can be used in photocatalytic reactors, solar cells, and pigments. For example, the $TiO_{2-x}N_x$ and/or $TiO_{2-1x}N_x[Pd]$ nanoparticles can be incorporated into porous silicon structures (e.g., micro/nanoporous structures) and act as a catalyst, a photocatalyst, or an electrode material.

$M_xO_yN_z$ Nanoparticles

Embodiments of the $M_xO_yN_z$ nanoparticles include, but are not limited to, the following formulas: $MO_{1-s}N_s$ (where s is in the range of about 0.001 to 0.5), $MO_{2-t}N_t$ (where t is in the range of about 0.001 to 0.5), $M_2O_{3-u}N_u$ (where u is in the range of about 0.001 to 0.5), $M_3O_{4-v}N_v$ (where v is in the range of about 0.001 to 0.5), and $M_2O_{5-w}N_w$ (where w is in the range of about 0.001 to 0.5). In addition, the $M_xO_yN_z$ nanoparticles are less than about 40 nanometers (nm) in diameter, in the range of about 8 nm to 40 nm, in the range of about 15 nm to 35 nm, and in the range of about 20 nm to 30 nm.

As indicated above, M includes the transition metals, the metalloids, the lanthanides, and the actinides. More specifically, M includes, but is not limited to, titanium (Ti), zirconium (Zr), hafnium (Hf), tin (Sn), nickel (Ni), cobalt (Co), zinc (Zn), lead (Pb), molybdenum (Mo), vanadium (V), aluminum (Al), niobium (Nb), tantalum (Ta), silicon (Si), silver (Ag), iridium (Ir), platinum (Pt), palladium (Pd), gold (Au), or combinations thereof. In particular, M can be Ti, Zr, Hf, Si, and Sn and, preferably, M is Ti.

Embodiments of the $M_xO_yN_z$ nanoparticles include, but are not limited to, $TiO_{2-t}N_t$ nanoparticles, $ZrO_{2-t}N_t$ nanoparticles, $HfO_{2-t}N_t$ nanoparticles, $SiO_{2-t}N_t$ nanoparticles, and $SnO_{2-t}N_t$ nanoparticles.

Embodiments of the $M_xO_yN_z$ nanoparticles have the characteristic that they are able to absorb radiation (i.e., light) in the range of about 350 nm to 2000 nm, about 500 nm to 2000 nm, about 540 nm to 2000 nm, about 450 nm to 800 nm, about 500 nm to 800 nm, about 540 nm to 800 nm, and about 540 nm to 560 nm. Preferably, the $M_xO_yN_z$ nanoparticles absorb radiation at about 550 nm, the peak of the solar spectrum.

In general, the $M_xO_yN_z$ nanoparticles may maintain their crystal structure upon nitridation. However, some embodiments of the $M_xO_yN_z$ nanoparticles may experience crystal phase transformation. In particular, nitridation of anatase $TiO_2$ nanoparticles does not appear to induce phase transformation whereas nitridation of $TiO_2$ nanoparticles in the presence of $PdCl_2$ results in a structural transformation (i.e., transformation from the anatase crystal phase to a complex mixed structural phase).

Methods of Making $M_xO_yN_z$ Nanoparticles

Embodiments of the present invention also include methods of preparing $M_xO_yN_z$ nanoparticles. An embodiment of a representative method includes mixing at room temperature at least one type of oxide nanoparticle ($M_hO_i$ nanoparticles (where h is in the range of about 1 to 3 and i is in the range of about 1 to 5)) with an excess of a solution having at least one type of alkyl amine. The solution can also contain hydrazine and/or ammonia.

In general, the $M_hO_i$ nanoparticles have a diameter of less than about 40 nm and less than about 30 nm. The $M_hO_i$ nanoparticles may be in several forms. In particular, the $M_hO_i$ nanoparticles can be suspended in a colloidal solution of one or more types of $M_hO_i$ nanoparticles; a gel of one or more types of $M_hO_i$ nanoparticles; one or more types of $M_hO_i$ nanoparticles; or combinations thereof.

For $M_hO_i$ nanoparticles, M includes the transition metals, the metalloids, the lanthanides, and the actinides. More specifically, M includes, but is not limited to, Ti, Zr, Hf, Sn, Ni, Co, Zn, Pb, Mo, V, Al, Nb, Ta, Si, Ag, Ir, Pt, Pd, Au, or combinations thereof. In particular, M can be Ti, Zr, Hf, Si, and Sn and, preferably, M is Ti.

The alkyl amine can include, but is not limited to, compounds having the formula of $N(R_1)(R_2)(R_3)$. $R_1$, $R_2$, and $R_3$ can each be selected from groups such as, but not limited to, a methyl group, an ethyl group, a propyl group, and a butyl group. The preferred alkyl amine is triethylamine. In general, an excess amount (based on the quantity of $M_hO_i$ nanoparticles) of alkyl amine is included in the mixture to ensure complete reaction of the $M_hO_i$ nanoparticles. However, it is contemplated and within the scope of this disclosure that amounts less than an excess of alkyl amine can be included in the mixture to produce $M_xO_yN_z$ nanoparticles.

Subsequent to providing $M_hO_i$ nanoparticles and the alkyl amine, the $M_hO_i$ nanoparticles and the alkyl amine can be mixed in a container, preferably a closed glass container with a magnetic stirring rod. Alternatively, the mixture can be mixed by shaking the container with a machine or by hand. The $M_hO_i$ nanoparticles and the alkyl amine are mixed until reaction between them is substantially complete, which may be indicated by an exothermic reaction (i.e., heat release) and/or by a color change of the mixture. The reaction typically takes less than 60 seconds and, preferably, less than 10 seconds to form $M_xO_yN_z$ nanoparticles.

After the reaction between the $M_hO_i$ nanoparticle and the alkyl amine is complete, the mixture is allowed to air dry. Subsequently, the mixture is dried under a vacuum (about $5 \times 10^{-2}$ torr) for less than approximately 12 hours. The $M_xO_yN_z$ nanoparticles are typically colored (e.g., a yellow to orange/red color for titanium oxynitride particles).

$M_xO_yN_z$ [$M_{CAT}$] Nanoparticles $M_xO_yN_z$ [$M_{CAT}$] nanoparticles include $M_xO_yN_z$ nanoparticles (as described above in reference to $M_xO_yN_z$ nanoparticles) having one or more catalytic metals ($M_{CAT}$) disposed thereon and/or incorporated therein. The $M_{CAT}$ can be a metal such as, but not limited to, palladium (Pd), silver (Ag), ruthenium (Rh), platinum (Pt), cobalt (co), copper (Cu), or iron (Fe).

It appears that the $M_{CAT}$ can be incorporated onto (or impregnates) the $M_xO_yN_z$ nanoparticles structure and/or the $M_{CAT}$ can be dispensed on the surface of the $M_xO_yN_z$ nanoparticles to form $M_xO_yN_z$ [$M_{CAT}$] nanoparticles. In addition, the $M_{CAT}$ can promote the alteration of the crystal structure of the $M_xO_yN_z$ nanoparticles. In one embodiment, the crystal structure of the $TiO_2$ nanoparticles changes from an anatase crystal structure to a complex structural mixture, which may include octahedrite crystal (e.g., $TiO_{2-t}N_t$[Pd] (where t is in the range of about 0.001 to 0.5)). This transformation of structure takes place upon reaction of the $TiO_2$ nanoparticles with an alkyl amine and $PdCl_2$.

Embodiments of the $M_xO_yN_z$ [$M_{CAT}$] nanoparticles may have the characteristic that they are able to absorb radiation (i.e., light) in the range of about 350 nm to about 2000 nm, about 500 nm to 2000 nm, about 540 nm to 2000 nm, about 450 nm to about 800 nm, about 500 nm to 800 nm, about 540 nm to 800 nm, and about 540 nm to 560 nm. Preferably, the $M_xO_yN_z$ [$M_{CAT}$] nanoparticles may absorb radiation at about 550 nm, the peak of the solar spectrum.

Methods of Making $M_xO_yN_z$ [$M_{CAT}$] Nanoparticles

Another embodiment of the present invention includes preparing $M_xO_yN_z$[$M_{CAT}$] nanoparticles by mixing at room temperature at least one type of $M_hO_i$ nanoparticle, a catalytic metal compound, and an excess of a solution having at least one type of alkyl amine. After the reaction between the at least one type of $M_hO_i$ nanoparticle, the catalytic metal compound, and the at least one type of alkyl amine is substantially complete, the mixture is allowed to air dry. Subsequently, the mixture is dried under a vacuum (about $5 \times 10^{-2}$ torr) for less than 12 hours. The resulting $M_xO_yN_z$ [$M_{CAT}$] nanoparticles are typically colored (i.e., a brown-black color for titanium oxynitride particles having Pd metal disposed thereon ($TiO_{2-x}N_x$[Pd])).

The catalytic metal compound can include compounds such as, but not limited to, palladium chloride ($PdCl_2$), silver chloride (AgCl), ruthenium chloride ($RhCl_4$), platinum chloride ($PtCl_2$), cobalt chloride ($CoCl_2$), copper chloride ($CuCl_2$), and iron chloride ($FeCl_2$). Not intending to be bound by theory, it appears that the catalytic metal compound may serve one or more purposes. For example, the catalytic metal compound catalyzes the reaction of the $M_hO_i$ nanoparticles and the alkyl amine, as well as the increased uptake of nitrogen to form $M_xO_yN_z$ [$M_{CAT}$] nanoparticles.

$M1_{x1}M2_{x2}O_yN_z$ Nanoparticles

Another embodiment of the present invention provides for oxynitride nanoparticles having the following formula: $M1_{x1}M2_{x2}O_yN_z$, where x1 and x2 are in the range from about 1 to 3, y is about 0.5 to less than 5, and z is about 0.001 to less than 5.

For the $M1_{x1}M2_{x2}O_yN_z$ nanoparticles, M1 and M2 can include the transition metals, the metalloids, the lanthanides, the actinides, or combinations thereof. More specifically, M1 and M2 include, but are not limited to, Ti, Zr, Hf, Sn, Ni, Co, Zn, Pb, Mo, V, Al, Nb, Ta, Si, Ag, Ir, Pt, Pd, Au, or combinations thereof. In particular, M1 and M2 can be Ti, Zr, Hf, Si, and Sn, or combinations thereof.

Embodiments of the $M1_{x1}M2_{x2}O_yN_z$ nanoparticles may have the characteristic that they are able to absorb radiation (i.e., light) in the range of about 350 nm to 2000 nm, about 500 nm to 2000 nm, about 540 nm to 2000 nm, about 450 nm to 800 nm, about 500 nm to 800 nm, about 540 nm to 800 nm, and about 540 nm to 560 nm. Preferably, the $M1_{x1}M2_{x2}O_yN_z$ nanoparticles may absorb radiation at about 550 nm, the peak of the solar spectrum.

Methods of Making $M1_{x1}M2_{x2}O_yN_z$ Nanoparticles

Embodiments of the present invention also include methods of preparing $M1_{x1}M2_{x2}O_yN_z$ nanoparticles. An embodiment of a representative method includes mixing at room temperature two types of oxide nanoparticles ($M_hO_i$ nanoparticles (where h is in the range of about 1 to 3 and i is in the range of about 1 to 5)) with an excess of a solution having at least one type of alkyl amine. The solution can also contain hydrazine and/or ammonia.

Subsequently, the two types of $M_hO_i$ nanoparticles and the alkyl amine can be mixed in a container, preferably a closed glass container, with a magnetic stirring rod. Alternatively, the mixture can be mixed by shaking the container with a machine or by hand. The two types of $M_hO_i$ nanoparticles and the alkyl amine are mixed until the reaction is substantially complete, which may be indicated by an exothermic reaction (i.e., heat release) and/or by a color change of the mixture. After the reaction between the two types $M_hO_i$ nanoparticles and the alkyl amine is complete, the mixture is allowed to air dry. Subsequently, the mixture is dried under a vacuum (about $5\times10^{-2}$ torr) for less than 12 hours.

Another representative method includes mixing a mixed oxide nanoparticle having the following formula: $M1_{h1}M2_{h2}O_i$ (where h1 and h2 can range from about 1 to 3 and i is in the range of about 1 to 5), with an excess of a solution having at least one type of alkyl amine. The solution can also contain hydrazine and/or ammonia.

Subsequently, the $M1_{h1}M2_{h2}O_i$ nanoparticles and the alkyl amine can be mixed in a container, preferably a closed glass container, with a magnetic stirring rod. Alternatively, the mixture can be mixed by shaking the container with a machine or by hand. The $M1_{h1}M2_{h2}O_i$ nanoparticles and the alkyl amine are mixed until the reaction is substantially complete, which may be indicated by an exothermic reaction (i.e., heat release) and/or by a color change of the mixture. After the reaction of the $M1_{h1}M2_{h2}O_i$ nanoparticles and the alkyl amine is complete, the mixture is allowed to air dry. Subsequently, the mixture is dried under a vacuum (about $5\times10^{-2}$ torr) for less than 12 hours.

M, M1, M2, and the alkyl amines correspond to the descriptions provided above and will not be described here in any more detail.

$M1_{x1}M2_{x2}O_yN_z$[$M_{CAT}$] Nanoparticles $M1_{x1}M2_{x2}O_yN_z$[$M_{CAT}$] nanoparticles include $M1_{x1}M2_{x2}O_yN_z$ nanoparticles described above in reference to $M1_{h1}M2_{h2}O_i$ nanoparticles) having one or more catalytic metals ($M_{CAT}$) disposed thereon and/or incorporated therein. As described above, the $M_{CAT}$ can be a metal such as, but not limited to, Pd, Ag, Rh, Pt, Co, Cu, or Fe.

Embodiments of the $M1_{x1}M2_{x2}O_yN_z$[$M_{CAT}$] nanoparticles may have the characteristic that they are able to absorb radiation (i.e., light) in the range of about 350 nm to 2000 nm, about 500 nm to 2000 nm, about 540 nm to 2000 nm, about 450 nm to 800 nm, about 540 nm to 800 nm, about 500 nm to 800 nm, and about 540 nm to 560 nm. Preferably, the $M1_{x1}M2_{x2}O_yN_z$[$M_{CAT}$] nanoparticles may absorb radiation at about 550 nm, the peak of the solar spectrum.

Methods of Making $M1_{x1}M2_{x2}O_yN_z$[$M_{CAT}$] Nanoparticles

Another embodiment of the present invention includes preparing $M1_{x1}M2_{x2}O_yN_z$[$M_{CAT}$] nanoparticles. A representative method includes mixing at room temperature two types of $M_hO_i$ nanoparticles with a catalytic metal compound and an excess of a solution having at least one type of alkyl amine. The solution can also contain hydrazine and/or ammonia.

Subsequently, the two types of $M_hO_i$ nanoparticles, the catalytic metal compound, and the alkyl amine can be mixed in a container, preferably a closed glass container, with a magnetic stirring rod. Alternatively, the mixture can be mixed by shaking the container with a machine or by hand. The two types of $M_hO_i$ nanoparticles, the catalytic metal compound, and the alkyl amine are mixed until the reaction is substantially complete, which may be indicated by an exothermic reaction (i.e., heat release) and/or by a color change of the mixture. After the reaction between the two types $M_hO_i$ nanoparticles, the catalytic metal compound, and the alkyl amine is complete, the mixture is allowed to air dry. Subsequently, the mixture is dried under a vacuum (about $5\times10^{-2}$ torr) for less than 12 hours.

Another representative method includes mixing $M1_{h1}M2_{h2}O_i$ with catalytic metal compound, and an excess of a solution having at least one type of alkyl amine. The solution can also contain hydrazine and/or ammonia. Subsequently, the $M1_{h1}M2_{h2}O_i$ nanoparticles, the catalytic metal compound, and the alkyl amine can be mixed in a container, preferably a closed glass container, with a magnetic stirring rod. Alternatively, the mixture can be mixed by shaking the container with a machine or by hand. The $M1_{h1}M2_{h2}O_i$ nanoparticles, the catalytic metal compound, and the alkyl amine are mixed until the reaction is substantially complete, which may be indicated by an exothermic reaction (i.e., heat release) and/or by a color change of the mixture. After the reaction of the $M1_{h1}M2_{h2}O_i$ nanoparticles, the catalytic metal compound, and the alkyl amine is complete, the mixture is allowed to air dry. Subsequently, the mixture is dried under a vacuum (about $5\times10^{-2}$ torr) for less than 12 hours.

M, M1, M2, $M_{CAT}$, the catalytic metal compound, and the alkyl amines correspond to the descriptions provided above and will not be described here in any more detail.

EXAMPLE 1

The following is a non-limiting illustrative example of an embodiment of the present invention. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the embodiments of the present invention.

This example discusses the formation of $TiO_{2-x}N_x$ nanoparticles on the order of seconds at room temperature employing the direct nitridation of $TiO_2$ nanostructures using alkyl ammonium compounds. Photocatalytically active $TiO_{2-x}N_x$ particles were produced, which absorb well into the visible region (i.e., from about 350 nm to 2000 nm). The $TiO_{2-x}N_x$ particles are (i) stable, (ii) inexpensive, (iii) have a conduction band minimum that is higher than the $H_2/H_2O$ couple (described above), and (iv) can absorb most of the photons of the solar spectrum.

$TiO_2$ nanoparticles prepared by the controlled hydrolysis of titanium (IV) tetraisopropoxide in water under deaerated conditions can vary in size between 3 and 11 nm and form a nearly transparent colloidal solution, which is stable for extended periods under refrigeration. Extended exposure to air at room temperature or controlled heating at 50° C. produces a mild agglomeration of the $TiO_2$ nanoparticles and results in the formation of a virtually opaque gel. Both the initial $TiO_2$ nanoparticle colloidal solution and the agglomerated gel solution are treated with an excess of triethylamine. The mixture is mixed with a Teflon®-coated magnetic stirrer (or shaken) in a small closed glass container. A reaction is found to take place readily between the $TiO_2$ nanoparticle colloidal solution and the triethylamine, which appears to be complete within several seconds following heat release and the formation of a yellowish, partially opaque, mixture. Upon drying and exposure to a vacuum of $5 \times 10^{-2}$ Torr for several hours, the treated, initially transparent, nanoparticle solution forms deep yellow crystallites whose transmission electron micrograph (TEM), high resolution (HR) TEM, and electron diffraction patterns are illustrated in FIGS. 1A and 1B. The treated, partially agglomerated, nanoparticle gel is found to form orange to orange-red crystallites. XRD and HR TEMs demonstrate that both the treated nanoparticle structures correspond dominantly to the anatase crystalline form of $TiO_{2-x}N_x$, as do the original $TiO_2$ nanoparticle crystallites.

Figure 2:
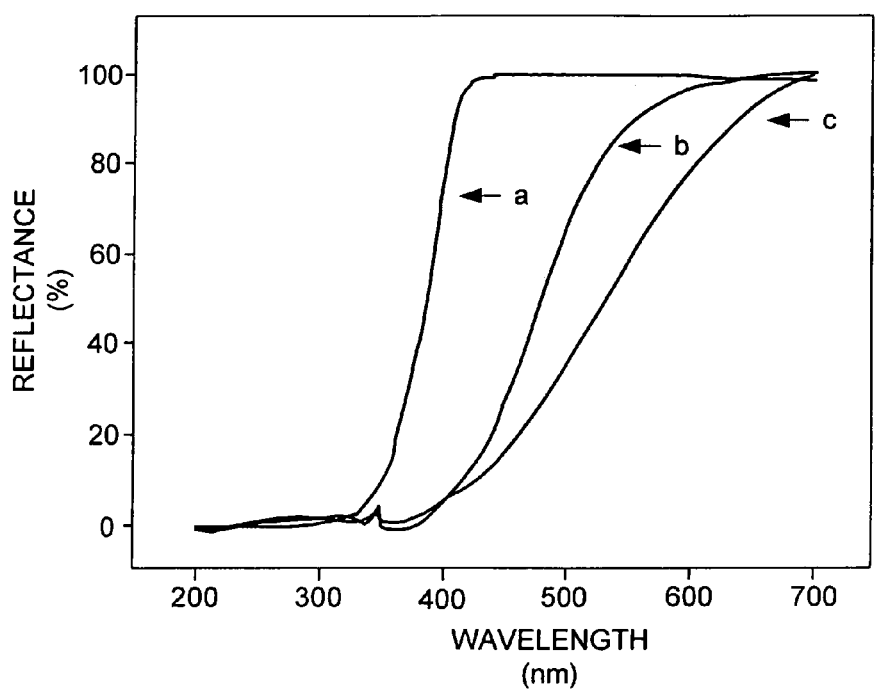
FIG. 2 includes (a) a reflection spectrum for Degussa P25™ $TiO_2$ whose reflection spectrum rises sharply at 380 nanometers (nm), (b) a reflection spectrum of titanium oxynitride nanoparticles (3–11 nm) whose spectrum rises sharply at 450 nm, and (c) a reflection spectrum of titanium oxynitride partially agglomerated nanoparticles whose spectrum rises sharply at 550 nm.

FIG. 2 compares (a) the optical reflectance spectrum for Degussa P25™ $TiO_2$ (reported at an average size of 30 nm), onsetting sharply at about 380 nm; (b) the reflectance spectrum for $TiO_{2-x}N_x$ nanoparticles (3–11 nm), rising sharply at 450 nm; and (c) the corresponding spectrum for $TiO_{2-x}N_x$ partially agglomerated nanoparticles, rising sharply at 550 nm.

In addition, $PdCl_2$ was introduced into another nitriding amine-$TiO_2$ mixture. The corresponding transmission electron micrograph and photoelectron spectra obtained for $TiO_{2-x}N_x$ nanoparticles (3–11 nm) with palladium incorporation (about 1 μg added to the nitriding solution), demonstrated not only the effects of an increased nitrogen uptake but also the impregnation of the $TiO_{2-x}N_x$ structure with reduced Pd nanostructures ($TiO_{2-x}N_x[Pd]$). Furthermore, it was observed that the $TiO_{2-x}N_x$ anatase crystal structure was also converted to alternate crystal phase forms (possible the octahedrite form) for some of the $TiO_{2-x}N_x$ nanoparticles. The $TiO_{2-x}N_x[Pd]$ agglomerated nanoparticles, which are brown-black in color, absorb radiation at wavelengths in the range of about 450 nm to 2000 nm.

In contrast to the nanoparticle activity, no measurable reaction or heat release is observed as either distinct rutile or anatase $TiO_2$ micropowders are treated directly with an excess of triethylamine. The treatment of DeGussa P25™ "nanopowder" (mean distribution of about 30 nm) results in a much slower reactive process, over several hours, which appears to decant the smaller nanoparticles from the material. The treatment forms a pale brown crystalline form, which yields a complex reflectance spectrum. The $TiO_2$ nanoparticle solutions also interact strongly with hydrazine and to a lesser extent with an ammonium hydroxide ($NH_3$) solution. However, the reaction with triethylamine is found to be facile at room temperature leading to nitrogen incorporation into the $TiO_2$ lattice to form $TiO_{2-x}N_x$ nanoparticles when the direct nitridation process is carried out at a nanometer scale.

Figure 3:
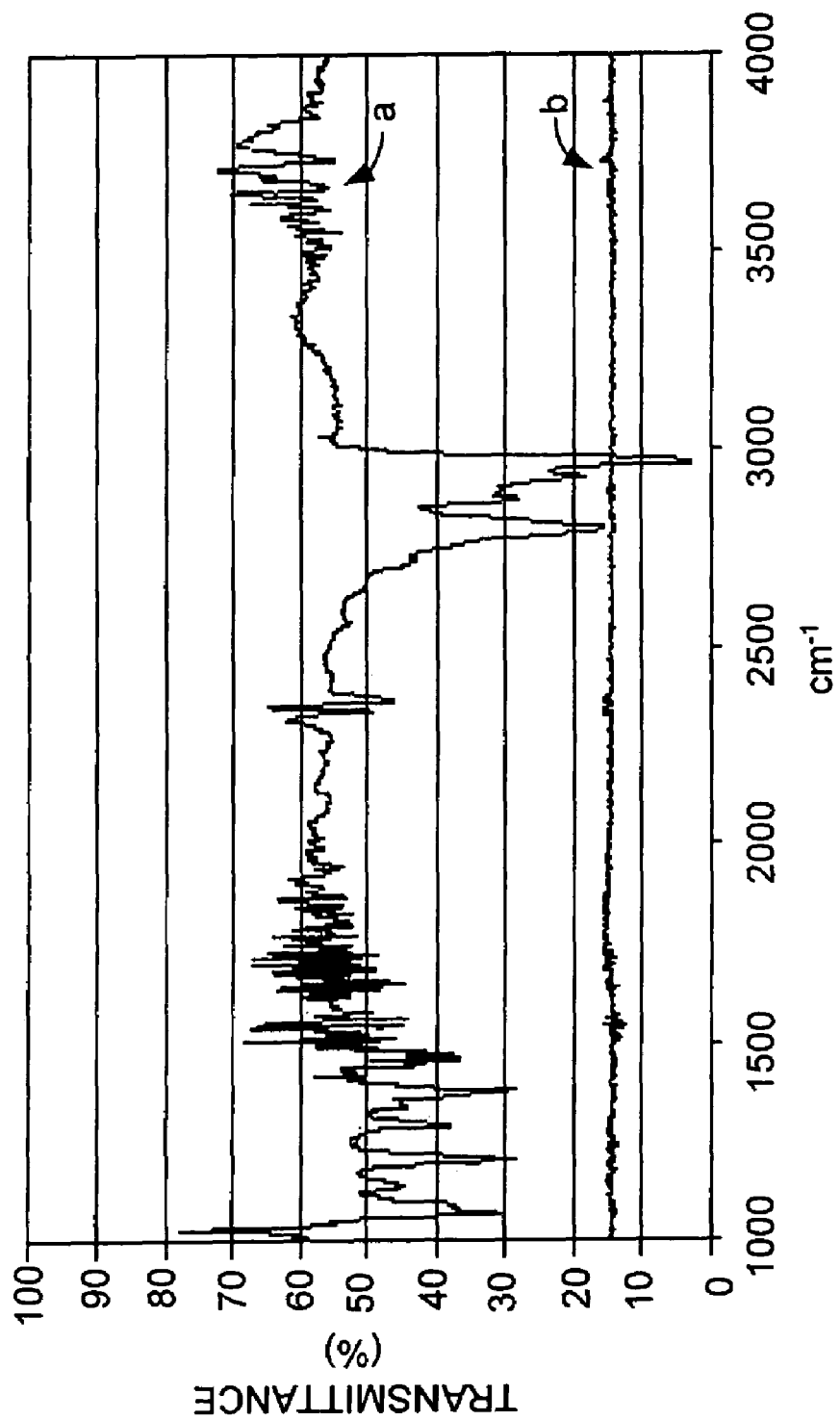
FIG. 3 includes (a) an infrared spectrum for triethylamine showing a clear C—H stretch region, and (b) an infrared spectrum of titanium oxynitride nanoparticles (3–11 nm) corresponding to the yellow titanium oxynitride crystallites whose reflection spectrum rises sharply at 450 nm.

The infrared spectra depicted in FIG. 3 demonstrate another aspect of the nitridation process. Specifically, there is no evidence for hydrocarbon incorporation in the final doped $TiO_2$ product. The IR spectrum shown in FIG. 3(a) corresponds to that for the trialkylamine, demonstrating, among other features, the clear alkyl C—H stretch region. In contrast, the IR spectrum shown in FIG. 3(b), corresponding to the yellow $TiO_{2-x}N_x$ nanocrystallites (yielding a reflectance spectrum of about 450 nm) pressed into a KBr pellet, shows virtually no infrared spectra especially in the C—H stretch region. This indicates virtually no residual organic incorporation after the air and vacuum drying processes have been performed on the nitrided $TiO_2$ nanoparticles. This observation is consistent both with photoelectron (XPS) and X-ray diffraction (XRD) studies.

Figure 4:
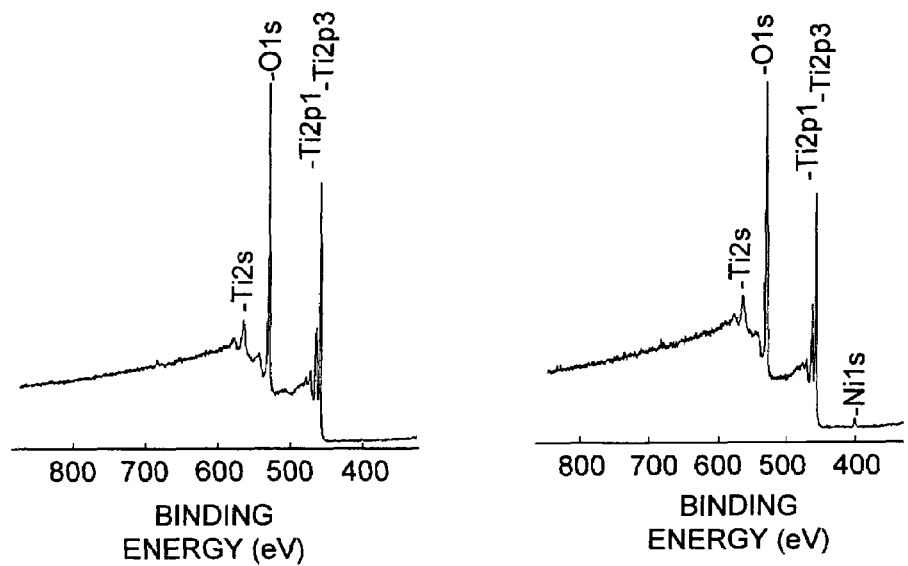
FIG. 4 is an XPS spectrum for untreated titanium dioxide nanoparticles and titanium oxynitride nanoparticles. The nitrogen peak, which is present in the titanium oxynitride nanoparticle sample, but not in the untreated titanium dioxide, is considerably more pronounced for the palladium treated titanium oxynitride nanoparticles.

XPS studies detect the presence of nitrogen not only at the surface, but also incorporated into the $TiO_{2-x}N_x$ nanoparticle agglomerates over a range from about 2.5 to 5.1 atomic % and increasing from about 7.5 to 17.1 atomic % for the Pd treated samples. XPS spectra for $TiO_2$ and $TiO_{2-x}N_x$ are compared in FIG. 4. The indicated nitrogen concentrations above should be compared to less than 1 atomic % for a virgin $TiO_2$ powder. The XRD data taken for $TiO_2$ (FIG. 5A) and the nitrided partially agglomerated $TiO_2$ gel solution (FIG. 5B) show the effects of a clear expansion of the "a" lattice parameter, due presumably to nitrogen incorporation. XRD is a sensitive tool for determining whether the nitrogen dopants are actually incorporated on interstitial lattice sites of the $TiO_2$ particles, or merely adsorbed at the surface. Nitrogen doping was found to lead to a measurable increase of the interplanar spacings in the agglomerated $TiO_2$ particles and peak broadening, which can be attributed to the strain fields of interstitially dissolved nitrogen atoms and also the breaking at the $TiO_2$ lattice structure. The analysis of the XRD patterns demonstrates the presence of a dominant anatase phase in both the untreated $TiO_2$ nanoparticles and the doped samples (Table 1 below) for either the nitrided $TiO_2$ nanoparticles (3–11 nm) or partially agglomerated $TiO_2$ nanoparticle samples. In this case no evidence for any degree of conversion from the anatase to the rutile structure was found.

TABLE 1

| Sample | Phase | a, (Å) | A, standard error (Å) | c (Å) | c, standard error (Å) |
| --- | --- | --- | --- | --- | --- |
| None Processed | Rutile | 4.5986 | .0006 | 2.9634 | .0006 |
| $TiO_2$ | Anatase | 3.7862 | .0004 | 9.5070 | .0011 |
| Orange $TiO_2$ | Anatase | 3.7942 | 00.32 | 9.4676 | .0075 |

Figure 6A:
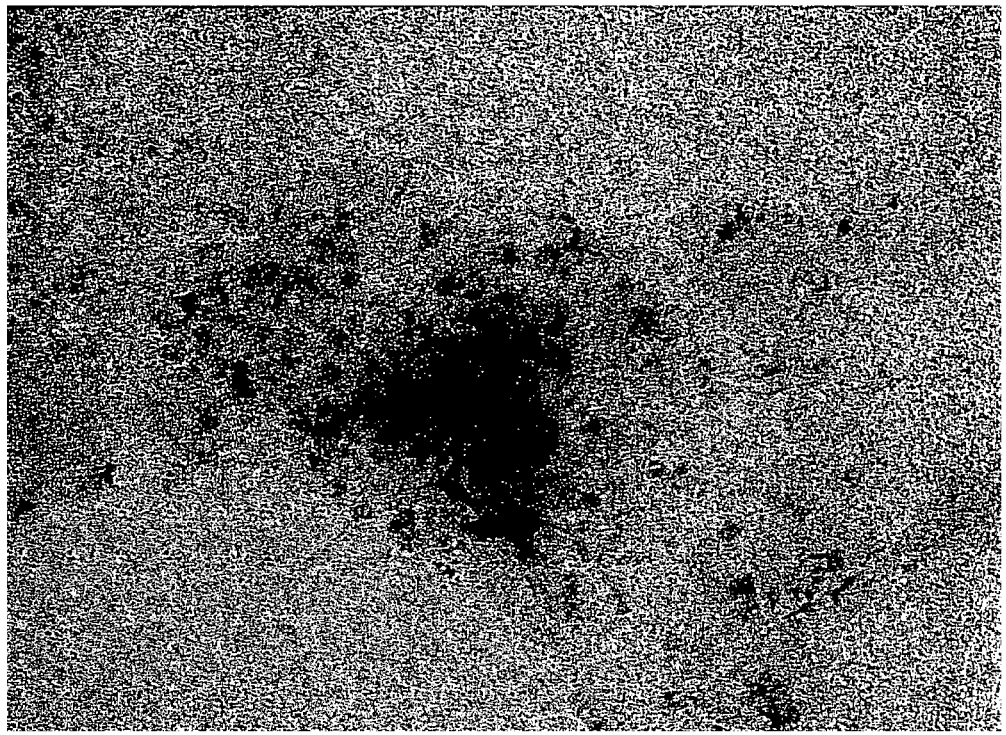
FIG. 6A is a TEM of a palladium metal impregnated titanium oxynitride nanostructure.
Figure 6B:
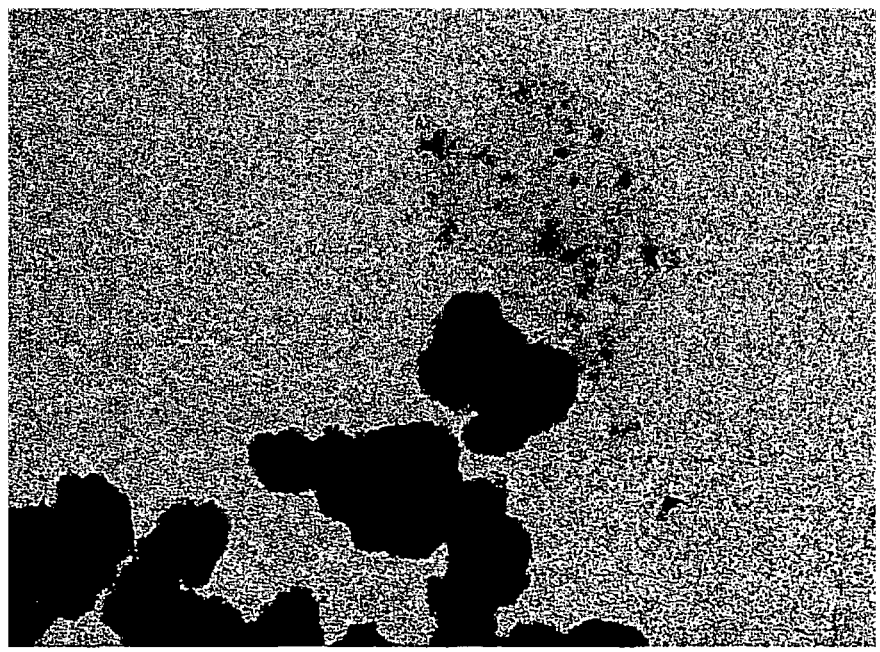
FIG. 6B is a TEM micrograph of a dark brown-black crystal phase accompanying the palladium impregnated nitride nanostructures. The dark crystallites are associated with a structural transformation (e.g., the analog of octahedrite in titanium dioxide).

However, the XRD pattern, observed for the nitrided $TiO_2$ nanoparticles (3–11 nm) treated with palladium is broad and complex, and demonstrates not only the formation of the Pd crystallites but also an apparent conversion from the anatase structure to an alternate phase, which may be, in part, the analog of the tetragonal octahedrite structure of $T_iO_2$. The TEM micrographs of FIGS. 6A and 6B demonstrate both the impregnation of the $T_iO_{2-x}N_x$ structure with smaller "reduced" palladium nanoparticles, as well as the formation of a significant additional alternate structure. The Pd treated samples appear black in color, indicating that they absorb well into the near infrared region.

Photocatalytic activity was evaluated by measuring the decomposition of methylene blue at 390 and 540 nm, respectively, using a Clark MXR™ 2001 femtosecond laser producing a 1 khz pulse train of 120 femtosecond pulses. The laser output was used to pump either an optical parametric amplifier to obtain tunable wavelengths in the visible spectrum including 540 nm or a second harmonic generation crystal to produce 390 nm.

Figure 7A:
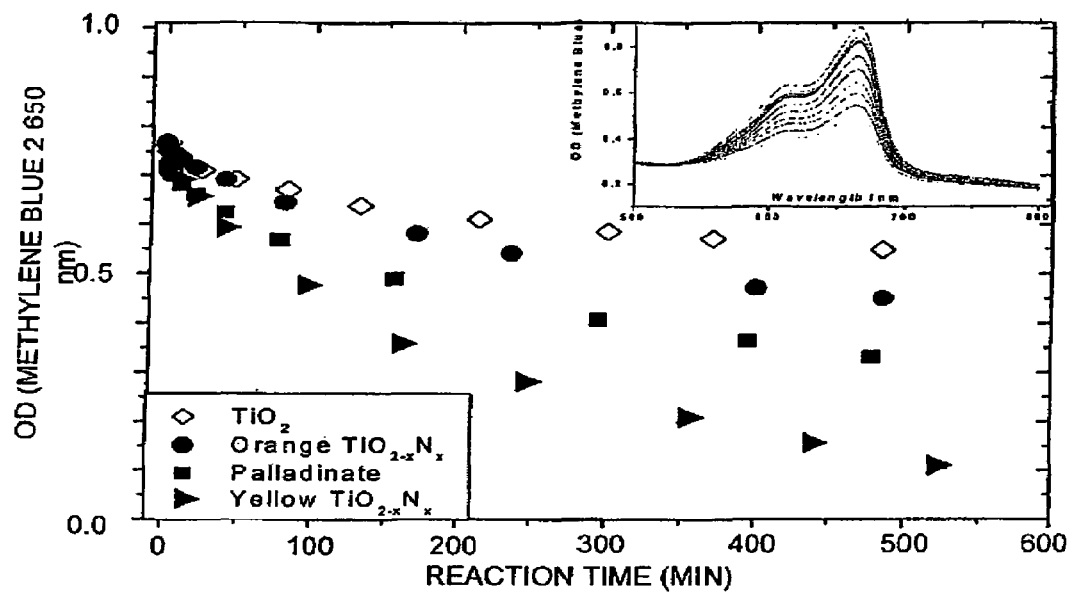
FIG. 7A is a graph illustrating the photodegradation of methylene blue in water at pH 7 and at about 390 nm.
Figure 7B:
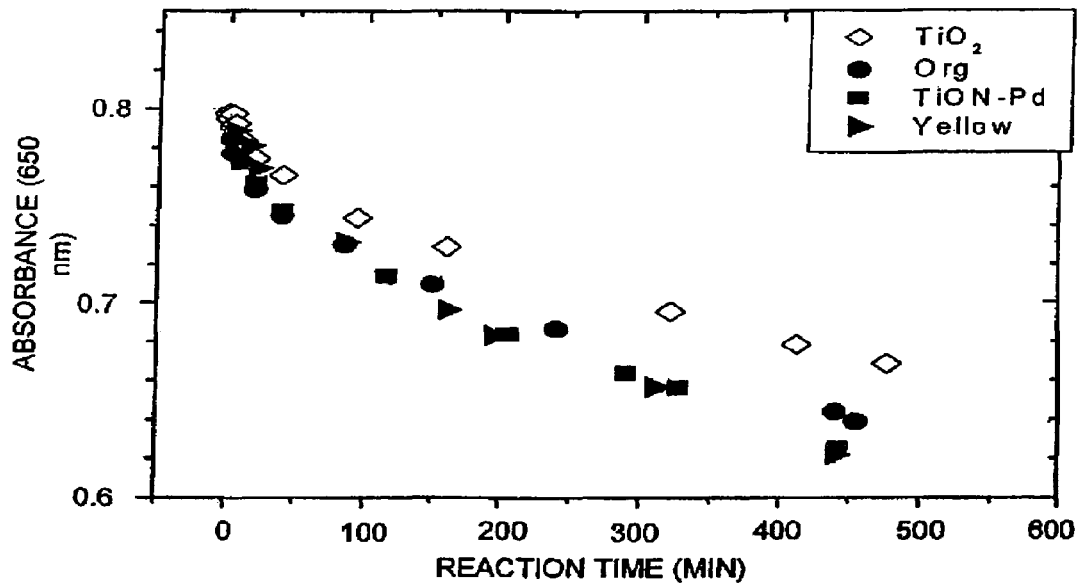
FIG. 7B is a graph illustrating the photodegredation of methylene blue in water at pH 7 and at about 540 nm.

FIG. 7A illustrates the photodegradation observed at 390 nm for methylene blue in water at ph 7. The data for the nitrided $TiO_2$ nanoparticle samples, as well as the palladium treated $TiO_2$ nanoparticles referred to above, are consistent with a notably enhanced activity for the $TiO_{2-x}N_x$ nanoparticle constituencies at 390 nm. FIG. 7B illustrates the photodegradation observed at 540 nm in which the partially agglomerated nitrided $TiO_{2-x}N_x$ and palladium treated $TiO_2$ nanoparticle samples still display a notable activity, whereas the activity for $TiO_2$ nanoparticle is considerably muted. In contrast, at wavelengths below 350 nm, the activity of both the $TiO_2$ nanoparticles and nitrided $TiO_2$ nanoparticle samples is comparable. Thus, nitrided $TiO_{2-x}N_x$ nanoparticle samples, which can be generated in several seconds at room temperature, are catalytically active at considerably longer wavelengths than $TiO_2$ nanoparticles.

These results demonstrate that by forming and adjusting an initial $TiO_2$ nanoparticle size distribution and mode of nanoparticle treatment, it is possible to tune and extend the absorption of a doped $TiO_{2-x}N_x$ sample well into the visible region. Further, these results indicate that an important modification of a $TiO_2$ photocatalyst can be made considerably simpler and more efficient by extension to the nanometer regime. The current process can produce submicrometer agglomerates of a desired visible light-absorbing $TiO_{2-x}N_x$ nanoparticle via a room temperature procedure, which otherwise is highly inefficient, if not inoperative, at the micron scale.

EXAMPLE 2

The following is a non-limiting illustrative example of an embodiment of the present invention. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the embodiments of the present invention.

This example discusses the formation of $ZrO_{2-x}N_x$ nanoparticles at room temperature employing the direct nitridation of $ZrO_2$ nanostructures using alkyl ammonium compounds. An excess volume of triethyl amine was added to a powder of zirconium dioxide ($ZrO_2$) nanoparticles and this mixture subsequently treated with $PdCl_2$. The mixture was mixed with a Teflon®-coated magnetic stirrer (or shaken) in a small closed glass container. A reaction was found to take place readily between the $ZrO_2$ powder/nanoparticles and the triethylamine and appears to quickly complete following heat release and the formation of a yellowish, partially opaque, mixture. Upon drying and exposure to a vacuum of $5 \times 10^{-2}$ Torr for several hours, the treated, initially white collodial, nanoparticle solution forms pale yellow crystallites. The change in color appears to indicate that nitrogen incorporation into the $ZrO_2$ powder has occurred to form $ZrO_{2-x}N_x$ nanostructures.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method comprising:
   providing at least one $M_hO_i$ nanoparticle, wherein h is in the range of about 1 to 3 and i is in the range of about 1 to 5;
   providing a solution of an alkyl amine;
   mixing the at least one $M_hO_i$ nanoparticle and the solution of alkyl amine until a reaction between the at least one $M_hO_i$ nanoparticle and alkyl amine is substantially complete; and
   forming a $M_xO_yN_z$ nanoparticle, wherein M is selected from the group consisting of: a metal, a metalloid, a lanthanide, and an actinide, wherein x is in the range of about 1 to 3, y is in the range of about 0.5 to less than 5, and z is in the range of about 0.001 to 0.5.

2. The method of claim 1, further comprising:
   providing a catalytic metal compound; and
   mixing the catalytic metal compound with the at least one $M_hO_i$ nanoparticle and the solution of alkyl amine until the reaction between the at least one $M_hO_i$ nanoparticle, alkyl amine, and catalytic metal compound is substantially complete.

3. The method of claim 1, wherein mixing includes:
   mixing the at least one $M_hO_i$ nanoparticle and the solution of alkyl amine for about 10 seconds.

4. The method of claim 1, further comprising:
   drying a product of the reaction between the at least one $M_hO_i$ nanoparticle and the solution of alkyl amine in a vacuum for less than about 12 hours.

5. The method of claim 1, wherein the alkyl amine is $N(R_1)(R_2)(R_3)$, wherein each of $R_1$, $R_2$, and $R_3$ is selected from the group consisting of: a methyl group, an ethyl group, a propyl group, and a butyl group.

6. The method of claim 1, wherein providing at least one $M_hO_i$ nanoparticle includes:
   providing at least one colloidal solution of at least one $M_hO_i$ nanoparticle.

7. The method of claim 1, wherein providing at least one $M_hO_i$ nanoparticle includes:
   providing at least one $M_hO_i$ nanoparticle dispersed in a gel solution.

8. The method of claim 1, wherein providing at least one $M_hO_i$ nanoparticle includes:
   providing at least one colloidal solution of at least one $M_hO_i$ nanoparticle, wherein the nanoparticle has a size less than about 40 nm.

9. The method of claim 1, wherein providing at least one $M_hO_i$ nanoparticle includes:

providing at least one $M_hO_i$ nanoparticle, wherein the nanoparticle has a size less than about 40 nm.

10. The method of claim 1, wherein mixing the at least one $M_hO_i$ nanoparticle and the solution of alkyl amine includes:
  mixing the at least one $M_hO_i$ nanoparticle with the solution of alkyl amine, wherein the alkyl amine is in excess of the at least one $M_hO_i$ nanoparticle.

11. The method of claim 1, wherein M is a metal.

12. The method of claim 1, wherein M is a metalloid.

13. A method comprising:
  providing at least two $M_hO_i$ nanoparticles, wherein h is in the range of about 1 to 3 and i is in the range of about 1 to 5 and wherein each of the at least two $M_hO_i$ nanoparticles are different;
  providing a solution of an alkyl amine;
  mixing the at least two $M_hO_i$ nanoparticles and the solution of alkyl amine until a reaction between the at least two $M_hO_i$ nanoparticles and alkyl amine is substantially complete and forming a $M1_{x1}M2_{x2}O_yN_z$ nanoparticle, wherein each of M, M1, and M2, are selected from the group consisting of: a metal, a metalloid, a lanthanide, and an actinide, wherein x1 is in the range of about 1 to 3, x2 is in the range of about 1 to 3, y is in the range of about 0.5 to less than 5, and z is in the range of about 0.001 to 0.5.

14. The method of claim 13, further comprising:
  providing a catalytic metal compound; and
  mixing the catalytic metal compound with the at least two $M_hO_i$ nanoparticles and the solution of alkyl amine until the reaction between the at least two $M_hO_i$ nanoparticles, the alkyl amine, and the catalytic metal compound is substantially complete.

15. The method of claim 13, wherein mixing includes:
  mixing the at least two $M_hO_i$ nanoparticles and the solution of alkyl amine for about 10 seconds.

16. The method of claim 13, further comprising:
  drying a product of the reaction between the at least two $M_hO_i$ nanoparticles and the solution of alkyl amine in a vacuum for less than about 12 hours.

17. The method of claim 13, wherein the alkyl amine is $N(R_1)(R_2)(R_3)$, wherein each of $R_1$, $R_2$, and $R_3$ is selected from the group consisting of: a methyl group, an ethyl group, a propyl group, and a butyl group.

18. The method of claim 13, wherein providing at least two $M_hO_i$ nanoparticles includes:
  providing at least one colloidal solution of at least two $M_hO_i$ nanoparticles.

19. The method of claim 13, wherein mixing the at least two $M_hO_i$ nanoparticles and the solution of alkyl amine includes:
  mixing the at least two $M_hO_i$ nanoparticles with the solution of alkyl amine, wherein the alkyl amine is in excess of the at least two $M_hO_i$ nanoparticles.

20. The method of claim 13, wherein M is a metal.

21. The method of claim 13, wherein M is a metalloid.

22. A method comprising:
  providing at least one $M1_{h1}M2_{h2}O_i$ nanoparticle, wherein h1 is in the range of about 1 to 3, h2 is in the range of about 1 to 3, and i is in the range of about 1 to 5;
  providing a solution of an alkyl amine;
  mixing the at least one $M1_{h1}M2_{h2}O_i$ nanoparticle and the solution of alkyl amine until the reaction between the at least one $M1_{h1}M2_{h2}O_i$ nanoparticle and alkyl amine is substantially complete; and
  forming a $M1_{x1}M2_{x2}O_yN_z$ nanoparticle, wherein each of M1 and M2 are selected from the group consisting of: a metal, a metalloid, a lanthanide, and an actinide, wherein x1 is in the range of about 1 to 3, x2 is in the range of about 1 to 3, y is in the range of about 0.5 to less than 5, and z is in the range of about 0.001 to 0.5.

23. The method of claim 22, further comprising:
  providing a catalytic metal compound; and
  mixing the catalytic metal compound with the at least one $M1_{h1}M2_{h2}O_i$ nanoparticle and the solution of alkyl amine until the reaction between the at least one $M1_{h1}M2_{h2}O_i$ nanoparticle, the alkyl amine, and the catalytic metal compound is substantially complete.

24. The method of claim 22, wherein mixing includes:
  mixing the at least one $M1_{h1}M2_{h2}O_i$ nanoparticle and the solution of alkyl amine for about 10 seconds.

25. The method of claim 22, further comprising:
  drying a product of the reaction between the at least one $M1_{h1}M2_{h2}O_i$ nanoparticle and the solution of alkyl amine in a vacuum for less than about 12 hours.

26. The method of claim 22, wherein the alkyl amine is $N(R_1)(R_2)(R_3)$, wherein each of $R_1$, $R_2$, and $R_3$ is selected from the group consisting of: a methyl group, an ethyl group, a propyl group, and a butyl group.

27. The method of claim 22, wherein providing at least one $M1_{h1}M2_{h2}O_i$ nanoparticle includes:
  providing at least one colloidal solution of at least one $M1_{h1}M2_{h2}O_i$ nanoparticle.

28. The method of claim 22, wherein mixing the at least one $M1_{h1}M2_{h2}O_i$ nanoparticle and the solution of alkyl amine includes:
  mixing the at least one $M1_{h1}M2_{h2}O_i$ nanoparticle with the solution of alkyl amine, wherein the alkyl amine is in excess of the at least one $M1_{h1}M2_{h2}O_i$ nanoparticle.

29. The method of claim 22, wherein M is a metal.

30. The method of claim 22, wherein M is a metalloid.

* * * * *